United States Patent
Shih

(10) Patent No.: US 7,525,368 B2
(45) Date of Patent: Apr. 28, 2009

(54) FUSE CIRCUIT

(75) Inventor: Jeng-Tzong Shih, Hsin Chu (TW)

(73) Assignee: Etron Technology, Inc., Hsin Chu (TW)

( * ) Notice: Subject to any disclaimer, the term of this patent is extended or adjusted under 35 U.S.C. 154(b) by 88 days.

(21) Appl. No.: 11/806,507

(22) Filed: May 31, 2007

(65) Prior Publication Data
US 2008/0054988 A1   Mar. 6, 2008

(30) Foreign Application Priority Data
Sep. 1, 2006   (TW) ............................. 95132271 A

(51) Int. Cl.
  *H01H 37/76* (2006.01)
(52) U.S. Cl. ..................... 327/525; 327/545; 365/225.7
(58) Field of Classification Search ........................ None
  See application file for complete search history.

(56) References Cited
U.S. PATENT DOCUMENTS 5,548,225 A * 8/1996 Rountree et al. .............. 326/13
5,566,107 A * 10/1996 Gilliam ....................... 365/200
5,600,277 A * 2/1997 Koelling ..................... 327/526
6,150,868 A * 11/2000 Kim et al. ................... 327/525
6,741,117 B2 * 5/2004 Lee ............................ 327/525
2004/0218328 A1 * 11/2004 Kuzuno et al. .............. 361/104

* cited by examiner

*Primary Examiner*—An T Luu
(74) *Attorney, Agent, or Firm*—Muncy, Geissler, Olds & Lowe, PLLC

(57) ABSTRACT

A fuse circuit comprises at least one fuse circuit unit and a current blocking module. The fuse circuit unit comprises a voltage establishing module and a latch. The voltage establishing module is coupled to a first reference voltage source and includes a fuse that is capable of being selectively blown according to an initial setting signal. The fuse has a first terminal coupled to a node and a second terminal. The voltage establishing module establishes a voltage level on the node according to the blown-off status of the fuse. The latch is coupled to the voltage establishing module through the node for latching the voltage level of the node and generating the output signal. The current blocking module is coupled between a second reference voltage source and the second terminal of the fuse for blocking the current flowing through the fuse while initial setting.

12 Claims, 7 Drawing Sheets

FUSE CIRCUIT

BACKGROUND OF THE INVENTION (a) Field of the Invention

The invention relates to a fuse circuit, and particularly to a fuse circuit with low power consumption.

(b) Description of the Related Art

FIG. 1 shows a schematic diagram illustrating a traditional fuse circuit 100. As shown in FIG. 1, the fuse circuit 100 includes a voltage establishing module 110 and a latch 120. The voltage establishing module 110 establishes a voltage level on a node A according to the blown-off status of a fuse I1 and the latch 120 subsequently latches the voltage level of the node A and generates an output signal.

Generally, the blown-off status of the fuse I1 is decided during the initial setting of the fuse circuit 100. In other words, a user can decide whether the fuse I1 is to be blown off or not during the initial setting so that the fuse circuit 100 provides different outputs.

An initial setting signal PU inputted to a transistor P3 of the voltage establishing module 110 is shown in FIG. 1. The initial setting signal PU has a low voltage level during the initial setting interval and a high voltage level after the initial setting. Therefore, the transistor P3 (PMOS) is conductive during the initial setting and becomes an open circuit after the initial setting.

Since the resistance of a fuse is generally smaller than the equivalent impedance of the transistor P3, the voltage on the node A is decided by the status of the fuse. In other words, if the fuse I1 is not blown off during the initial setting, the fuse I1 forms a closed circuit with the reference voltage source Vss and therefore the voltage level on the node A is pushed down to Vss. On the other hand, if the fuse I1 is blown off during initial setting, the transistor P3 is connected to the reference voltage source Vdd and therefore the voltage level on the node A is raised up to Vdd.

The latch 120 then latches the voltage level of the node A for generating a corresponding output. The latch 120 includes an inverter, including transistors N1 and P1, and a feedback transistor P2. If the fuse I1 is not blown off, the fuse I1 makes the voltage level on the node A down to Vss, as shown in FIG. 1, so that the output is kept at the high voltage Vdd. Since the transistor P2 is now non-conductive, the voltage level on the node A is kept at Vss. If the fuse I1 is blown off and the initial setting signal PU is at the low voltage level, the voltage level on the node A is Vdd and the output of the latch 120 is corresponding to the low voltage level Vss. Since the transistor P2 is now conductive, the voltage level on the node A is kept at Vdd.

However, the above mentioned fuse circuit structure has various disadvantages. At first, if blowing off the fuse I1 is not necessary during the initial setting, then both the fuse I1 and the transistor P3 are now conductive and that means considerably large dc current flows through the voltage establishing module 110 and therefore the power consumption of the fuse circuit 100 is increased. Furthermore, if the fuse I1 is not completely blown off during the initial setting, leakage current flows through the fuse I1 and the transistor P2 during the normal operation of the fuse circuit 100 to result not only in the increase of the power consumption of the fuse circuit 100 but also in the failure of the initial setting.

To resolve the above mentioned problems, FIG. 2 shows a schematic diagram illustrating a fuse circuit 200 according to another prior art. As shown in FIG. 2, a transistor N2 (NMOS) is provided between the fuse I1 and the node A in the fuse circuit 200. During the initial setting, the transistor N2 forms an open circuit and thus no current flows through fuse I1 to thereby solve one of the problems mentioned in the above.

However, the structure of the fuse circuit 200 induces another problem. Since the fuse circuit 200 is generally implemented with considerably large quantities in integrated circuits (such as those implemented in DRAM), one additional transistor N2 is added for each fuse circuit 200 and thus the manufacturing cost is definitely increased. Furthermore, the fuse circuit 200 cannot solve the problem of the leakage current that flows through the fuse I1 that is incompletely blown off and the transistor P2.

BRIEF SUMMARY OF THE INVENTION

In light of the above mentioned problems, one object of the invention is to provide a fuse circuit having low power consumption.

According to one embodiment of the invention, a fuse circuit for providing an output signal according to an initial setting signal is disclosed. The voltage level state of the initial setting signal is divided into a setting interval and a normal operating interval. The fuse circuit includes at least one fuse circuit unit and a current blocking module.

The fuse circuit unit comprises a voltage establishing module and a latch. The voltage establishing module is coupled to a first reference voltage source. The voltage establishing module includes a fuse that is capable of being selectively blown. The fuse has a first terminal and a second terminal. The first terminal is coupled to a node. The voltage establishing module establishes a voltage level on the node according to the blown-off status of the fuse. The latch is coupled to the voltage establishing module through the node for latching the voltage level of the node and generating the output signal.

The current blocking module is coupled between a second reference voltage source and the second terminal of the fuse for blocking the current flowing through the fuse during the setting interval of the initial setting signal.

Furthermore, according to one embodiment of the invention, a fuse circuit is disclosed for providing an output signal according to an initial setting signal. The voltage level state of the initial setting signal is divided into a setting interval and a normal operating interval. The fuse circuit includes a voltage establishing module and a latch.

The voltage establishing module is coupled between a first reference voltage source and a first node, and includes a fuse that is capable of being selectively blown. The fuse is coupled between the first node and a second node. The voltage establishing module establishes a voltage level on the second node according to the blown-off status of the fuse.

The latch is coupled to the second node for latching the voltage level of the second node and generating the output signal.

Furthermore, the first node receives a control signal. The voltage level of the control signal is at a floating voltage level during the setting interval of the initial setting signal. The control signal is at a third voltage level during a first interval of the normal operating interval of the initial setting signal. The first interval is after the setting interval.

Under the consideration of cost, the fuse circuit according to the invention not only can eliminate the dc current during the initial setting of the fuse circuit to achieve the purpose of low power consumption but also can eliminate the leakage current of the fuse circuit during the normal operation. Furthermore, the power consumption is also reduced.

DETAILED DESCRIPTION OF THE INVENTION

Figure 1:
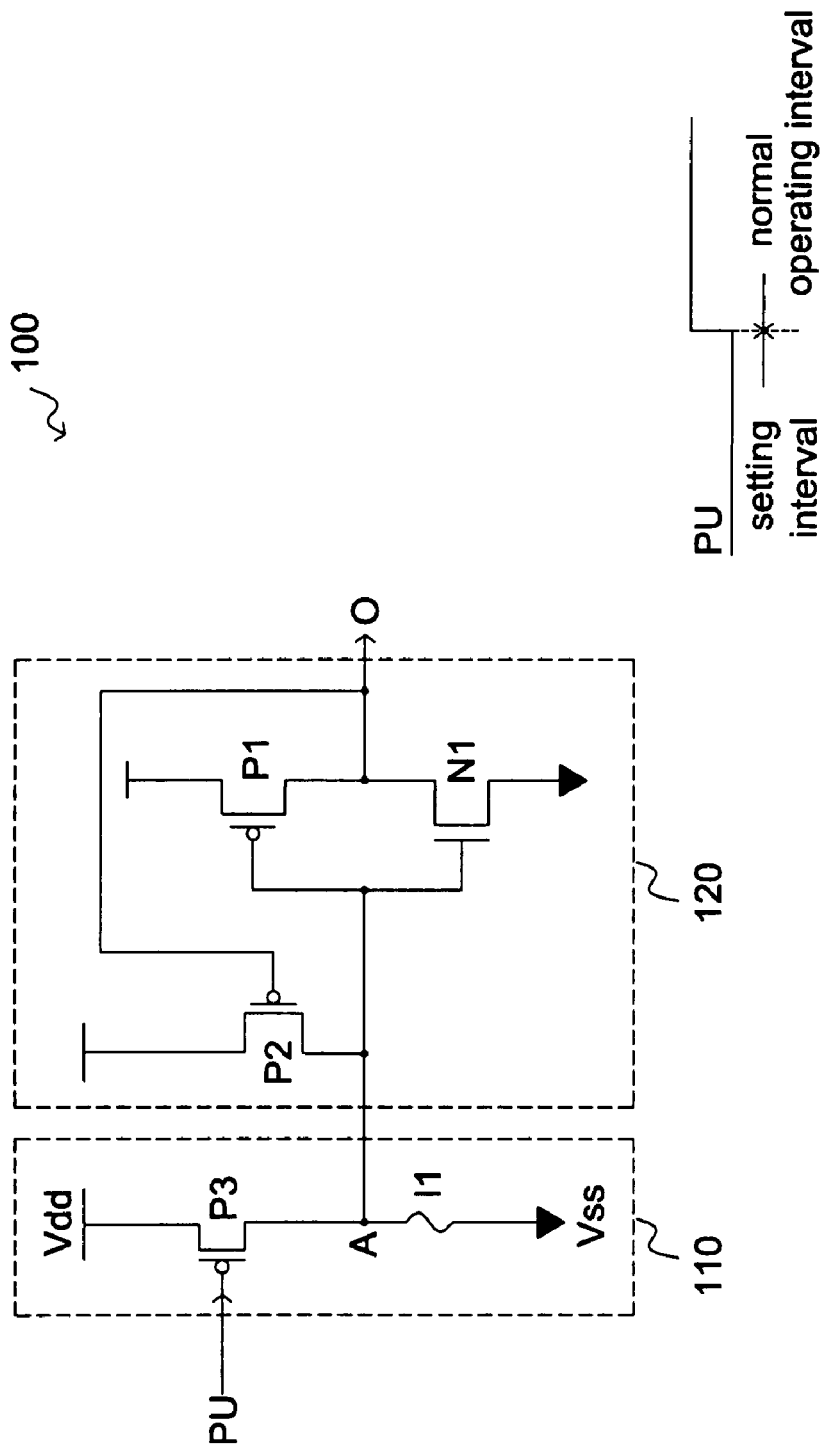
FIG. 1 shows a schematic diagram illustrating a fuse circuit according to prior art.
Figure 2:
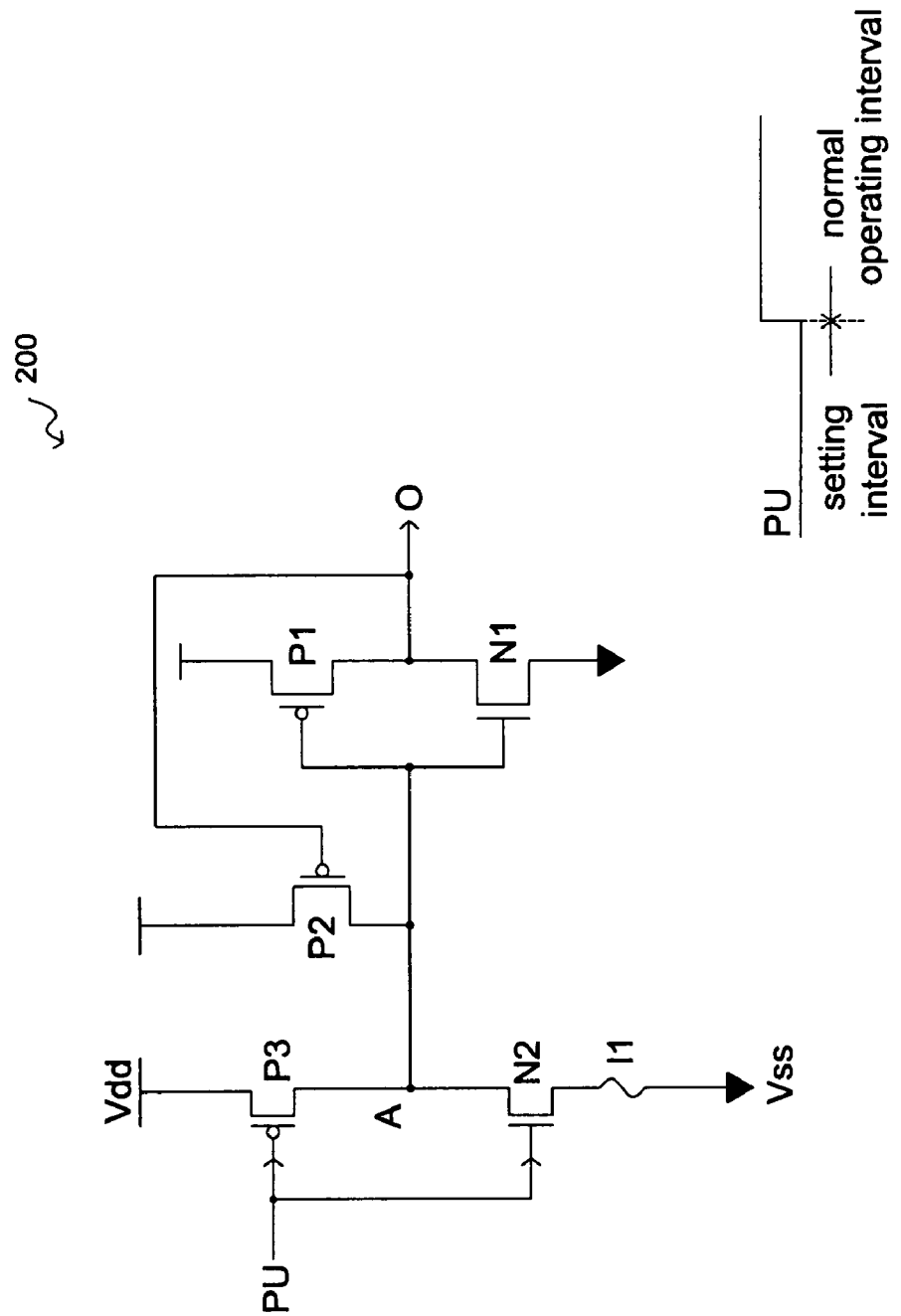
FIG. 2 shows a schematic diagram illustrating a fuse circuit according to another prior art.
Figure 3:
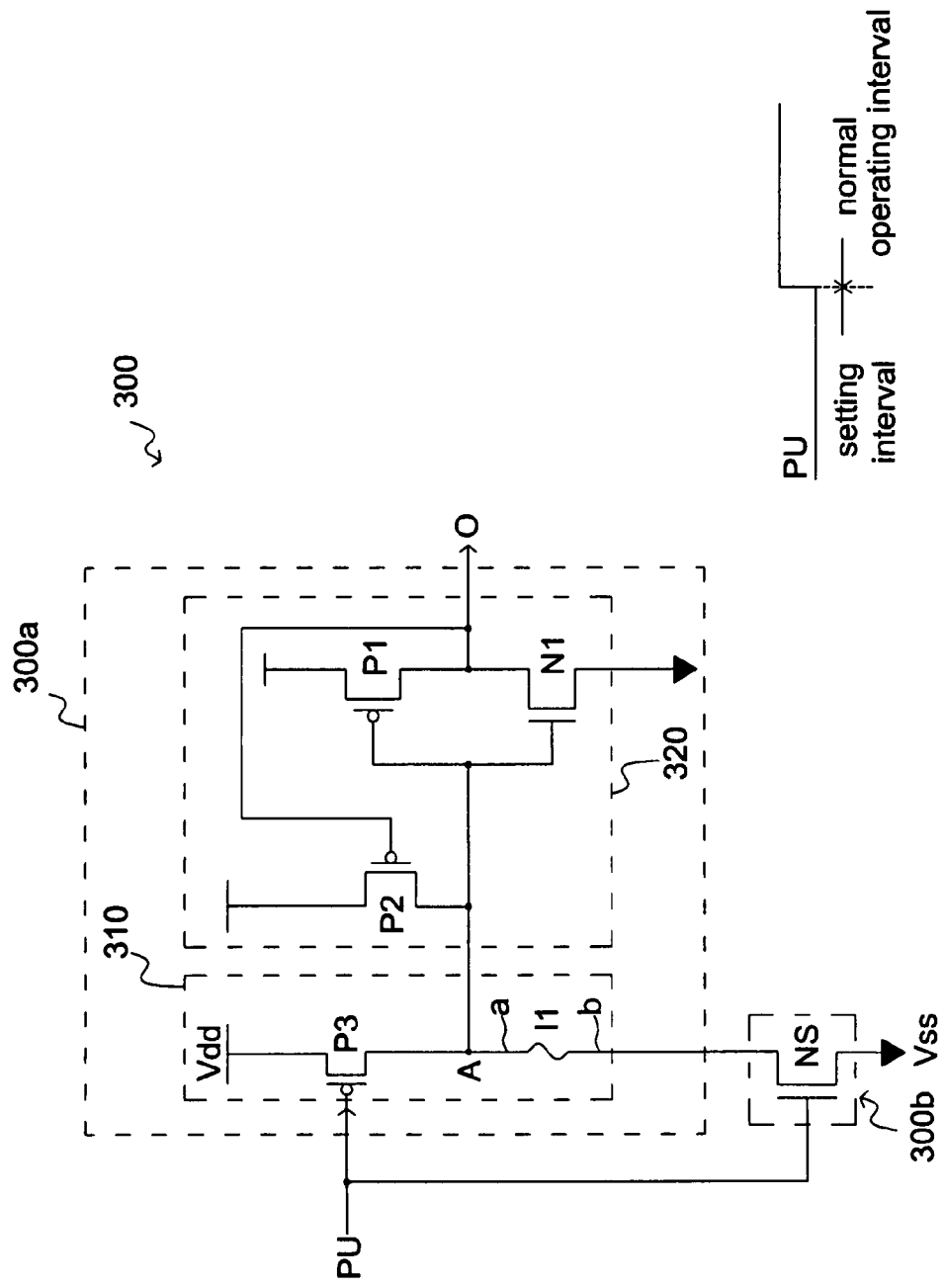
FIG. 3 shows a schematic diagram illustrating a fuse circuit according to a first embodiment of the invention.

FIG. 3 shows a schematic diagram illustrating a fuse circuit 300 according to a first embodiment of the invention. Referring to FIG. 3, the fuse circuit 300 according to the invention includes a fuse circuit unit 300a and a current blocking module 300b. The fuse circuit 300 provides an output signal O according to an initial setting signal PU. The voltage level state of the initial setting signal is divided into a setting interval and a normal operating interval.

The fuse circuit unit 300a includes a voltage establishing module 310 and a latch 320. The voltage establishing module 310 establishes a voltage level on the node A according to the blown-off status of the fuse I1 that is capable of being selectively blown. The fuse I1 has a first terminal a and a second terminal b. The latch 320 latches the voltage level of the node A and generates an output signal. As illustrated in the figure, the transistors P1 and N1 of the latch 320 are interconnected to form an inverter.

It should be noted that the current blocking module 300b blocks the current flowing through the fuse I1 during the setting interval of the initial setting signal PU to reduce the power consumption of the fuse circuit 300. Since the coupling of all the elements is shown in FIG. 3, the detailed description of connection is not given here.

Furthermore, as shown in FIG. 3, the voltage level state of the initial setting signal PU is at a low voltage level while initial setting (that is during the setting interval of the initial setting signal PU) and is at a high voltage level after initial setting (that is during the normal operating interval of the initial setting signal PU). The current blocking module 300b of the embodiment includes a transistor NS (NMOS) that is coupled between the reference voltage source Vss and the fuse I1. It should be noted that the transistor P3 and the transistor NS are both used as switches, both gate electrodes of which are coupled to the initial setting signal PU, so that the voltage level of the initial setting signal PU determines that the transistor P3 and the transistor NS are either conductive or non-conductive.

The operation of the fuse circuit 300 is described as the following. During the setting interval of the initial setting signal PU, the transistor P3 is conductive and forms a closed circuit with the reference voltage source Vdd so that the voltage level of the node A is raised to Vdd. However, as the transistor NS is an NMOS transistor, it forms a non-conductive open circuit during the setting interval and blocks the current flowing through the fuse I1. In other words, there is no large dc current flowing through the voltage establishing module 310 during the setting interval of the initial setting signal PU in the embodiment of the invention. Therefore, the problem in the prior art is solved.

If the fuse I1 is blown off during the setting interval of the initial setting signal PU in the embodiment of the invention, the transistor P3 and the fuse I1 form an open circuit after the initial setting is completed (the normal operating interval of the initial setting signal PU). The voltage level of the node A is thus kept at the voltage level Vdd, while completing the initial setting. On the other hand, if the fuse I1 is not blown off during the setting interval of the initial setting signal PU, the transistor NS becomes conductive and forms a closed circuit with the fuse I1 after the initial setting (the normal operating interval of the initial setting signal PU) and the voltage level of the node A is pushed down to Vss through the fuse I1 and the transistor NS.

Then, the latch 320 latches the voltage level of the node A and generates a corresponding output according to the voltage level of the node A. It should be noted that the latch 320 has the same circuit structure and operation as the traditional latch 120. Unnecessary details are not given here. For example, the output signal O of the latch 320 is the inverted signal of the signal on the node A and if the voltage level of the node A is at the Vdd voltage level, then the latch 320 latches the voltage level Vdd.

Figure 4:
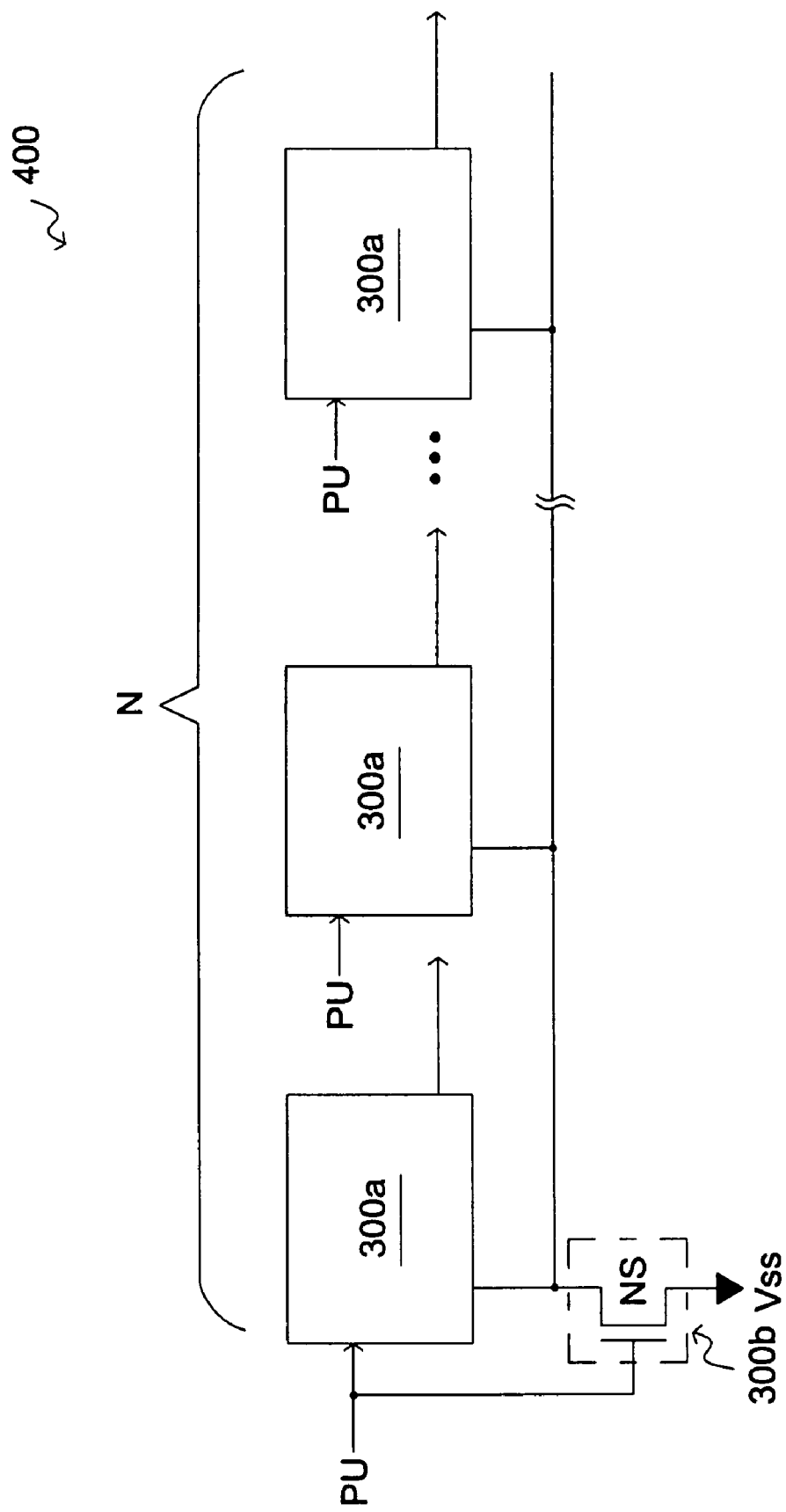
FIG. 4 shows a schematic diagram illustrating a fuse circuit having a plurality of fuse circuit units.

Furthermore, as the transistor NS is coupled between the reference voltage source Vss and the fuse I1, the fuse circuit 300 has another advantage. FIG. 4 shows a schematic diagram illustrating a fuse circuit 400 having a plurality of the fuse circuit units 300a. As described previously, large quantities of the fuse circuit units 300a may be required to be implemented in the integrated circuit (DRAM) as repair circuits. As shown in FIG. 4, for the whole fuse circuit 400 according to the invention, it is not necessary to implement an additional transistor NS for each fuse circuit unit 300a (a total of N number of transistors). Only one transistor NS is required to block all the dc current of all the fuse circuit units 300a of the fuse circuit 400 while initial setting. In other words, referring to FIG. 3 and FIG. 4 simultaneously, the current blocking module 300b (the transistor NS of the embodiment of the invention) is coupled between the second reference voltage source Vss and the second terminal b of each fuse I1 of each fuse circuit unit 300a so that every fuse circuit unit 300a shares the same current blocking model 300b. Hence, the dc current flow during the setting interval of the initial setting signal PU can be successfully eliminated with lower cost (only one transistor NS is needed) according to the invention.

It should be noted that the above disclosed embodiment of the current blocking module 300b is implemented with an NMOS but the invention is not limited by such implementation. In practice, as long as the current blocking module forms an open circuit during the setting interval of the initial setting signal PU and becomes conductive during the normal operating interval of the initial setting signal PU, the current blocking module can be implemented by a wide variety of electrical circuit elements, such as switches, relays. Such variations are also considered to be in the scope of the invention.

Figure 5:
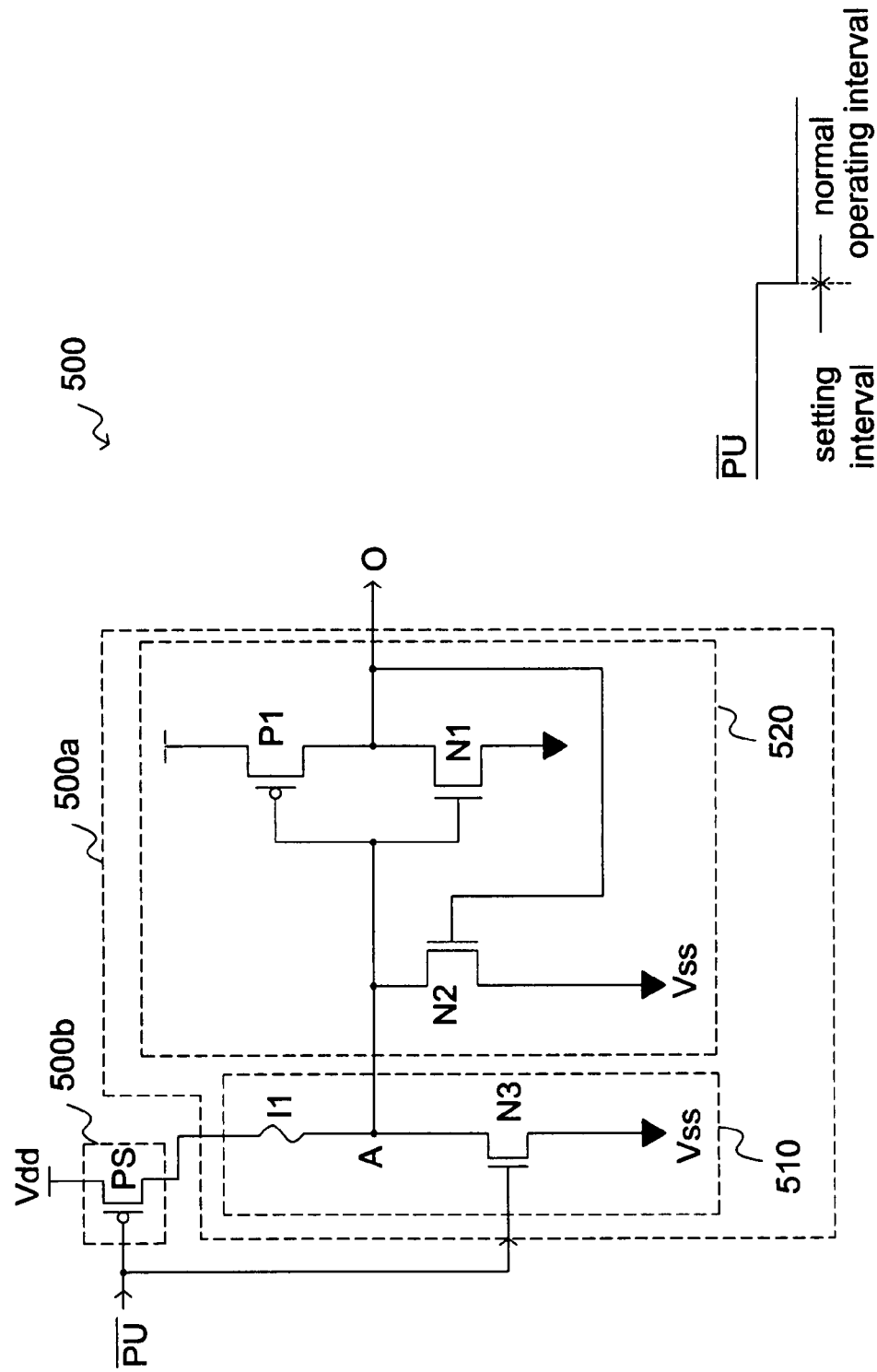
FIG. 5 shows a schematic diagram illustrating a fuse circuit according to a second embodiment of the invention.

FIG. 5 shows a schematic diagram illustrating a fuse circuit 500 according to a second embodiment of the invention. The fuse circuit 500 includes a fuse circuit unit 500a and a current blocking module 500b. The fuse circuit unit 500a includes a latch 520 and a voltage establishing module 510. It should be noted that the fuse circuit 500 and the fuse circuit 300 operate similarly and have similar functions. The difference is that in the fuse circuit 500, the fuse I1 capable of being selectively blown is coupled between the node A and the reference voltage source Vdd and besides a transistor N3 is coupled between the reference voltage source Vss and the node A. In addition, the control signal inputted to the transistor N3 is an inverted signal $\overline{PU}$ of the initial setting signal PU. Therefore, when the fuse I1 is blown off during the setting interval of the inverted signal $\overline{PU}$, a low voltage level Vss can be established on the node A. When the fuse is not blown off, a high voltage level Vdd is established on the node A after the initial setting (the normal operating interval of the inverted signal $\overline{PU}$). The current blocking module 500b (transistor PS) is also used to block the current from flowing through the fuse I1 during the setting interval of the inverted signal $\overline{PU}$ for reducing the power consumption of the fuse circuit 500.

The latch 520 is modified accordingly based on the construction of the voltage establishing module 510. Therefore, in order to latch the low voltage level Vss established through the transistor N3 in the embodiment of the invention, the feedback transistor N2 is modified to be an NMOS that is connected to the reference voltage source Vss. Based on the description disclosed till now, those who are skilled in the art should be able to understand the operating principle and related functions of the fuse circuit 500. Thus, unnecessary details are not given here.

Figure 6:
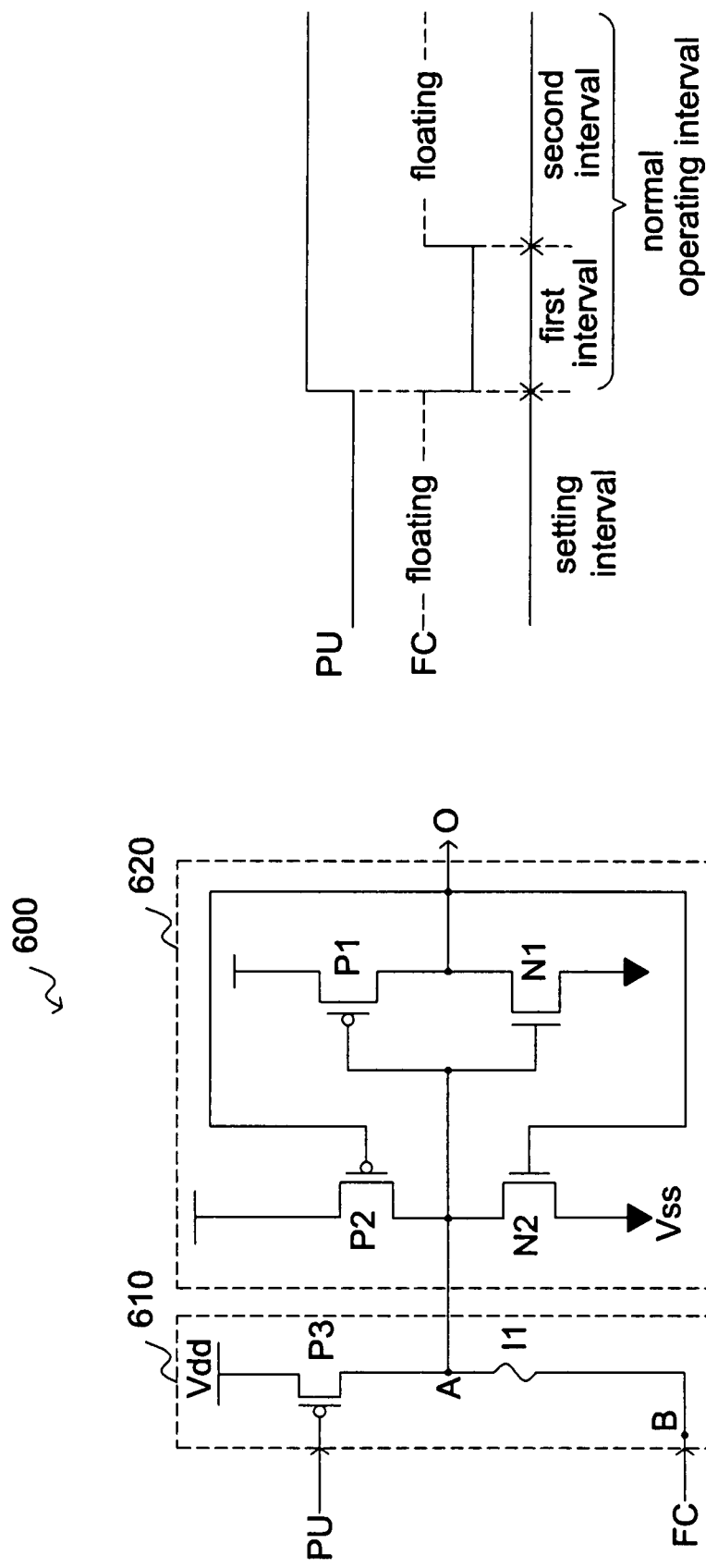
FIG. 6 shows a schematic diagram illustrating a fuse circuit according to a third embodiment of the invention.

FIG. 6 shows a schematic diagram illustrating a fuse circuit 600 according to a third embodiment of the invention. As shown in FIG. 6, the fuse circuit 600 includes a voltage establishing module 610 and a latch 620. The voltage establishing module 610 establishes a voltage level on the node A according to the blown-off status of the fuse I1 that is capable of being selectively blown. The latch 620 then latches the voltage level established on the node A and generates an output signal.

However, the fuse I1 is not coupled to the reference voltage source Vss but is coupled to another control signal FC in the embodiment of the invention. The control signal FC has different voltage levels in accord with the different status of the fuse circuit 600. The timing sequence of the initial setting signal PU and the control signal FC is shown in FIG. 6. The voltage level state of the initial setting signal PU in this embodiment is divided into a setting interval and a normal operating interval. The normal operating interval is further divided into a first interval and a second interval, as shown in FIG. 6. The initial setting signal PU is at a low voltage level during the setting interval and at a high voltage level during the subsequent normal operating interval. On the other hand, the control signal FC is at a floating voltage level during the setting interval and the second interval and at a low voltage level during the first interval.

The operation of the fuse circuit 600 is described as the following. At first, the transistor P3 is conductive during the setting interval and the voltage of the node A is raised to Vdd.

At the present, if the fuse I1 is blown off during the setting interval of the initial setting, then the node A is corresponding to a high voltage level after the initial setting (the normal operating interval). On the other hand, if the fuse I1 is not blown off during the setting interval, the node A is coupled to the control signal FC that is at a low voltage level through the fuse I1 during the first interval of the normal operating interval. Thus the node A is pushed down to a low voltage level.

In the first embodiment, the node A of the fuse circuit 300 is still coupled to the reference voltage source Vss and kept at the voltage level Vss, when fuse I1 is not blown off. But, in the present embodiment, the voltage level of the node A is pushed down by the control signal FC only during the first interval. Therefore, for the sake of assurance, the latch 620 is a full latch that includes two inverters with cross-coupled output terminals and input terminals. The full latch means the latch 620 can latch and maintain the voltage level of the node A that is either at a high voltage level or a low voltage level. Thus the latch 620 generates an output according to the voltage level of the node A. It should be noted that the latch 620 outputs an inverted signal of the signal on the node A as the output of the fuse circuit 600.

Since the control signal FC is always at a floating voltage level except during the first interval, no dc current flows through the fuse I1 during the setting interval. Since the transistor P3 forms an open circuit during the first interval, there is no dc current flowing through the fuse I1. Thus, the voltage establishing module 610 does not have the dc current flow problem that appeared in the prior art during the setting interval. Besides, if the fuse is not completely blown off during the setting interval, the control signal FC is still at a floating voltage level during the second interval and no current flows through the fuse I1. In other words, there is no leakage current from the transistor P2 flowing through the fuse I1 during the second interval. Thus, the leakage current problem in the prior art is solved.

It should be noted that the invention does not limit the duration of the first interval. In principle, the duration is only required to be long enough to push down the voltage level of the node A in order to drive the latch 620. Although the node B is coupled to the control signal FC in the above embodiment, it is only one example of the invention and is not to be considered as a limitation of the invention. In practice, the node B can be either coupled to a floating voltage level or coupled to the reference voltage source Vss through a switching circuit according to the above mentioned timing sequence. Such variation is also considered to be in the scope of the invention.

Figure 7:
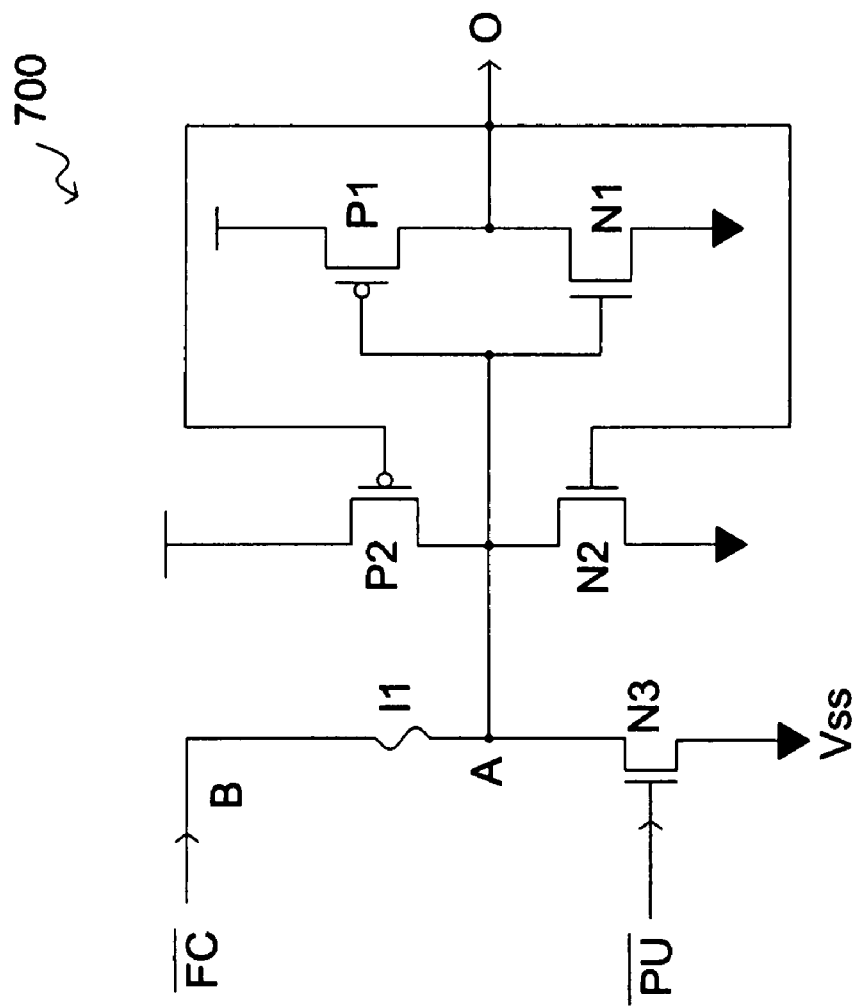
FIG. 7 shows a schematic diagram illustrating a fuse circuit according to a fourth embodiment of the invention

FIG. 7 shows a schematic diagram illustrating a fuse circuit 700 according to a fourth embodiment of the invention. Basically, the operation of the fuse circuit 700 is similar to that of the fuse circuit 600 and the fuse circuit 700 has similar functions as the fuse circuit 600. The difference is that the fuse circuit 700 uses a transistor N3 (NMOS) to replace the transistor P3 and the transistor N3 is coupled between the reference voltage source Vss and the node A. Therefore, the control signal should be set as the inverted signals $\overline{PU}$ and $\overline{FC}$ of the above mentioned initial setting signals PU and FC, respectively. Based on the description disclosed till now, those who are skilled in the art should understand the operating principle and related functions. Unnecessary details are not given here.

Compared to the prior art, the fuse circuit according to one of the embodiments of the invention not only eliminates the dc current of the fuse circuit during the initial setting with lower cost but also achieve the purpose of reducing the power consumption. According to another embodiment of the invention, the invention eliminates not only the dc current of the fuse circuit during the initial setting but also the leakage current of the fuse circuit during the normal operation and reduces the power consumption.

Although the embodiments according to the invention are described in the above, these do not limit the scope of the invention. Various modifications and changes can be made by those who are skilled in the art without deviating from the essence of the invention.

What is claimed is:

1. A fuse circuit for providing an output signal according to an initial setting signal, the state of whose voltage level is divided into a setting interval and a normal operating interval, the fuse circuit comprising:

at least one fuse circuit unit comprising a voltage establishing module and a latch wherein the voltage establishing module is coupled to a first reference voltage source, the voltage establishing module comprises a fuse that is capable of being selectively blown and has a first terminal and a second terminal, the first terminal is coupled to a node, the voltage establishing module establishes a voltage level on the node according to the blown-off status of the fuse, and the latch is coupled to the voltage establishing module through the node for latching the voltage level of the node and generating the output signal;

a current blocking module coupled between a second reference voltage source and the second terminal of the fuse for blocking the current flowing through the fuse during the setting interval of the initial setting signal; and a plurality of the fuse circuit units;

wherein the current blocking module is coupled between the second reference voltage source and the second terminal of each fuse in the plurality of the fuse circuit units.

2. The fuse circuit according to claim 1, wherein the latch comprising:

an inverter coupled to the node for providing the output signal; and a third switch module in which a first terminal of the third switch module is coupled to the node and an input terminal of the inverter, and a second terminal of the third switch module is coupled to an output terminal of the inverter.

3. The fuse circuit according to claim 1, wherein the voltage establishing module further comprises a first switch module coupled between the first reference voltage source and the node for receiving the initial setting signal and the first switch module is conductive during the setting interval of the initial setting signal but non-conductive during the normal operating interval of the initial setting signal.

4. The fuse circuit according to claim 3, wherein the current blocking module comprises a second switch module coupled between the second reference voltage source and the second terminal of the fuse for receiving the initial setting signal and the second switch module is non-conductive during the setting interval of the initial setting signal but conductive during the normal operating interval of the initial setting signal.

5. The fuse circuit according to claim 4, wherein the first switch module and the second switch module are metal oxide semiconductor field effect transistors.

6. The fuse circuit according to claim 5, wherein the first switch module is an N type metal oxide semiconductor field effect transistor having its gate electrode coupled to the initial setting signal and the second switch module is a P type metal oxide semiconductor field effect transistor having its gate electrode coupled to the initial selling signal.

7. The fuse circuit according to claim 5, wherein the first switch module is a P type metal oxide semiconductor field effect transistor having its gate electrode coupled to the initial setting signal and the second switch module is an N type metal oxide semiconductor field effect transistor having its gate electrode coupled to the initial setting signal.

8. A fuse circuit for providing an output signal according to an initial setting signal, the state of whose voltage level is divided into a setting interval and a normal operating interval, the fuse circuit comprising:

a voltage establishing module that is coupled to a first reference voltage source and a first node, comprises a fuse that is capable of being selectively blown coupled between the first node and a second node, and establishes a voltage level on the second node according to the blown-off status of the fuse; and a latch that is coupled to the second node for latching the voltage level of the second node and generating the output signal;

wherein the first node receives a control signal in which the control signal is at a floating voltage level during the setting interval of the initial setting signal, at a third voltage level during a first interval of the normal operating interval, being after the setting interval.

9. The fuse circuit according to claim 8, wherein the voltage establishing module further comprises a switch module coupled between the first reference voltage level and the second node and the switch module is conductive during the setting interval of the initial setting signal but non-conductive during the normal operating interval of the initial setting signal.

10. The fuse circuit according to claim 9, wherein the switch module is a metal oxide semiconductor field effect transistor.

11. The fuse circuit according to claim 8, wherein the latch comprises:

a first inverter having a first input terminal and a first output terminal wherein the first input terminal is coupled to the first node; and a second inverter having a second input terminal and a second output terminal wherein the second input terminal is coupled to the first output terminal of the first inverter and the second output terminal is coupled to the first node;

wherein the latch generates the output signal at the first output terminal.

12. The fuse circuit according to claim 8, wherein the control signal is at a floating voltage level during a second interval of the normal operating interval and the second interval is after the first interval.

* * * * *